United States Patent
Cheng

(10) Patent No.: US 7,961,016 B2
(45) Date of Patent: Jun. 14, 2011

(54) CHARGE PUMP AND CHARGING/DISCHARGING METHOD CAPABLE OF REDUCING LEAKAGE CURRENT

(75) Inventor: Wen-Chang Cheng, Taoyuan (TW)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 160 days.

(21) Appl. No.: 12/500,568

(22) Filed: Jul. 9, 2009

(65) Prior Publication Data

US 2011/0006836 A1    Jan. 13, 2011

(51) Int. Cl.
*H03L 7/06* (2006.01)

(52) U.S. Cl. ........................................ 327/157; 327/148

(58) Field of Classification Search ................ 327/147, 327/148, 156, 157
See application file for complete search history.

(56) References Cited

U.S. PATENT DOCUMENTS

| | | | | |
|---|---|---|---|---|
| 5,362,990 A * | 11/1994 | Alvarez et al. | | 327/538 |
| 6,586,976 B2 * | 7/2003 | Yang | | 327/157 |
| 6,611,160 B1 * | 8/2003 | Lee et al. | | 327/157 |
| 6,917,192 B1 * | 7/2005 | Xin-LeBlanc et al. | | 324/76.53 |
| 6,919,746 B2 * | 7/2005 | Suzuki | | 327/157 |
| 6,960,949 B2 * | 11/2005 | Suzuki | | 327/157 |
| 6,963,232 B2 * | 11/2005 | Frans et al. | | 327/156 |
| 6,968,167 B1 * | 11/2005 | Wu et al. | | 455/251.1 |
| 7,015,736 B1 * | 3/2006 | Sudjian et al. | | 327/157 |
| 7,132,865 B1 * | 11/2006 | Terrovitis et al. | | 327/157 |
| 7,139,540 B2 * | 11/2006 | Wu et al. | | 455/251.1 |
| 7,705,641 B2 * | 4/2010 | Wu et al. | | 327/157 |
| 7,777,541 B1 * | 8/2010 | Stansell et al. | | 327/157 |
| 7,863,953 B2 * | 1/2011 | Li | | 327/156 |
| 2003/0231036 A1 * | 12/2003 | Lee et al. | | 327/156 |
| 2003/0231037 A1 * | 12/2003 | Lee et al. | | 327/157 |
| 2005/0162201 A1 * | 7/2005 | Suzuki | | 327/157 |
| 2005/0162202 A1 * | 7/2005 | Suzuki | | 327/157 |
| 2010/0156484 A1 * | 6/2010 | Wu et al. | | 327/157 |
| 2010/0289539 A1 * | 11/2010 | Wu | | 327/157 |

* cited by examiner

*Primary Examiner* — Lincoln Donovan
*Assistant Examiner* — Adam D Houston
(74) *Attorney, Agent, or Firm* — Winston Hsu; Scott Margo

(57) ABSTRACT

A charge pump includes a first transistor, a second transistor, a first, a second and a third selectors. The first transistor includes a gate electrode, a first electrode, and a second electrode which serves as an output port of the charge pump. The second transistor includes a gate electrode, a first electrode and a second electrode, where the gate electrode of the first transistor is coupled to the gate electrode of the second transistor, and the gate electrode of the second transistor is coupled to the second electrode of the second transistor. The first selector is utilized for selectively connecting the first transistor to a first supply voltage. The second selector is utilized for selectively connecting the first transistor to a second supply voltage. The third selector is utilized for selectively connecting the second transistor to the second supply voltage.

10 Claims, 4 Drawing Sheets

CHARGE PUMP AND CHARGING/DISCHARGING METHOD CAPABLE OF REDUCING LEAKAGE CURRENT

BACKGROUND OF THE INVENTION

1. Field of the Invention

The present invention relates to a charge pump, and more particularly, to a charge pump and a charging/discharging method capable of reducing a leakage current.

2. Description of the Prior Art

A phase-locked loop (PLL) generally serves as a clock generator or a frequency synchronizer and is widely applied in electronics and communications devices. The conventional PLL includes a phase detector, a charge pump, a filter and a voltage control oscillator (VCO), where one input of the phase detector is connected to the output of the VCO. The other input of the phase detector is connected to a reference frequency generator. The output of the phase detector is a function of the difference between the phases of the two input signals and is inputted to the filter via the charge pump for generating a control voltage, which is supplied to the VCO.

When the PLL needs to lock an output frequency of the VCO, the charge pump is disconnected from the phase detector to make the control voltage generated from the charge pump/filter maintain a constant value. However, at the time the charge pump is disconnected from the phase detector, a leakage current of the charge pump will enter the filter and change the control voltage of the VCO, resulting in an inaccurate output frequency of the VCO. In particular, when the phase difference between two input signals of the phase detector is very small, the output frequency of the VCO will be seriously influenced.

SUMMARY OF THE INVENTION

It is therefore and objective of the present invention to provide a charge pump and a charging/discharging method which can reduce a leakage current, to solve the above-mentioned problem.

According to one embodiment of the present invention, a charge pump comprises a first transistor, a second transistor, and first, second and third selectors. The first transistor includes a gate electrode, a first electrode, and a second electrode which serves as an output port of the charge pump. The second transistor includes a gate electrode, a first electrode and a second electrode, where the gate electrode of the first transistor is coupled to the gate electrode of the second transistor, and the gate electrode of the second transistor is coupled to the second electrode of the second transistor. The first selector is coupled between the first electrode of the first transistor and a first supply voltage, and is utilized for selectively connecting the first transistor to the first supply voltage. The second selector is coupled between the second electrode of the first transistor and a second supply voltage, and is utilized for selectively connecting the first transistor to the second supply voltage. The third selector is coupled between the second electrode of the first transistor and the second supply voltage, and is utilized for selectively connecting the second transistor to the second supply voltage.

According to another embodiment of the present invention, a charging/discharging method capable of reducing a leakage current comprises: providing a first transistor, wherein the first transistor includes a gate electrode, a first electrode, and a second electrode which serves as an output port; providing a second transistor, where the second transistor includes a gate electrode, a first electrode and a second electrode, wherein the gate electrode of the first transistor is coupled to the gate electrode of the second transistor, and the gate electrode of the second transistor is coupled to the second electrode of the second transistor; providing a first selector coupled between the first electrode of the first transistor and a first supply voltage to selectively connect the first transistor to the first supply voltage; providing a second selector coupled between the second electrode of the first transistor and a second supply voltage to selectively connect the first transistor to the second supply voltage; and providing a third selector coupled between the second electrode of the first transistor and the second supply voltage to selectively connect the second transistor to the second supply voltage.

According to the charge pump and the charging/discharging method, the output of the charge pump will not be influenced by a leakage current, and an accuracy of an output frequency of the VCO is improved.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
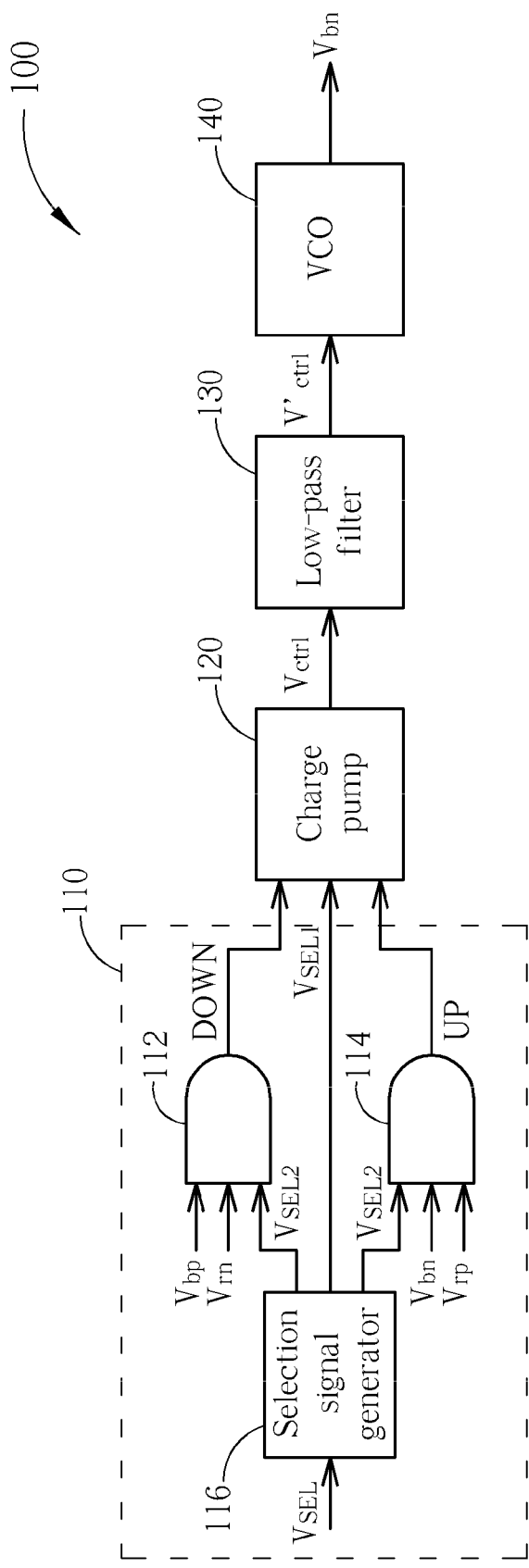
FIG. 1 is a diagram illustrating a phase-locked loop (PLL) according to one embodiment of the present invention.

Please refer to FIG. 1. FIG. 1 is a diagram illustrating a phase-locked loop (PLL) 100 according to one embodiment of the present invention. The PLL 100 includes a phase detector 110, a charge pump 120, a low-pass filter 130 and a voltage control oscillator (VCO) 140, where the phase detector 110 includes two AND gates 112, 114 and a selection signal generator 116.

In the operations of the PLL 100, the phase detector 110 receives a feedback signal $V_{bn}$ and its inverted signal $V_{bp}$, a reference signal $V_{rn}$ and its inverted signal $V_{rp}$, and a selection signal $V_{SEL2}$ from which two detected signals UP and DOWN are generated, where the selection signal $V_{SEL2}$ is generated from the selection signal generator 116 and is for determining whether the charge pump 120 is connected to the phase detector 110. Then, the charge pump 120 receives the detected signals UP and DOWN to generate a control signal $V_{ctrl}$, and the low-pass filter 130 filters the control signal $V_{ctrl}$ and generates a filtered control signal $V_{ctrl}'$. Finally, the VCO 140 receives the filtered control signal $V_{ctrl}'$ and generates the feedback signal $V_{bn}$.

Figure 2:
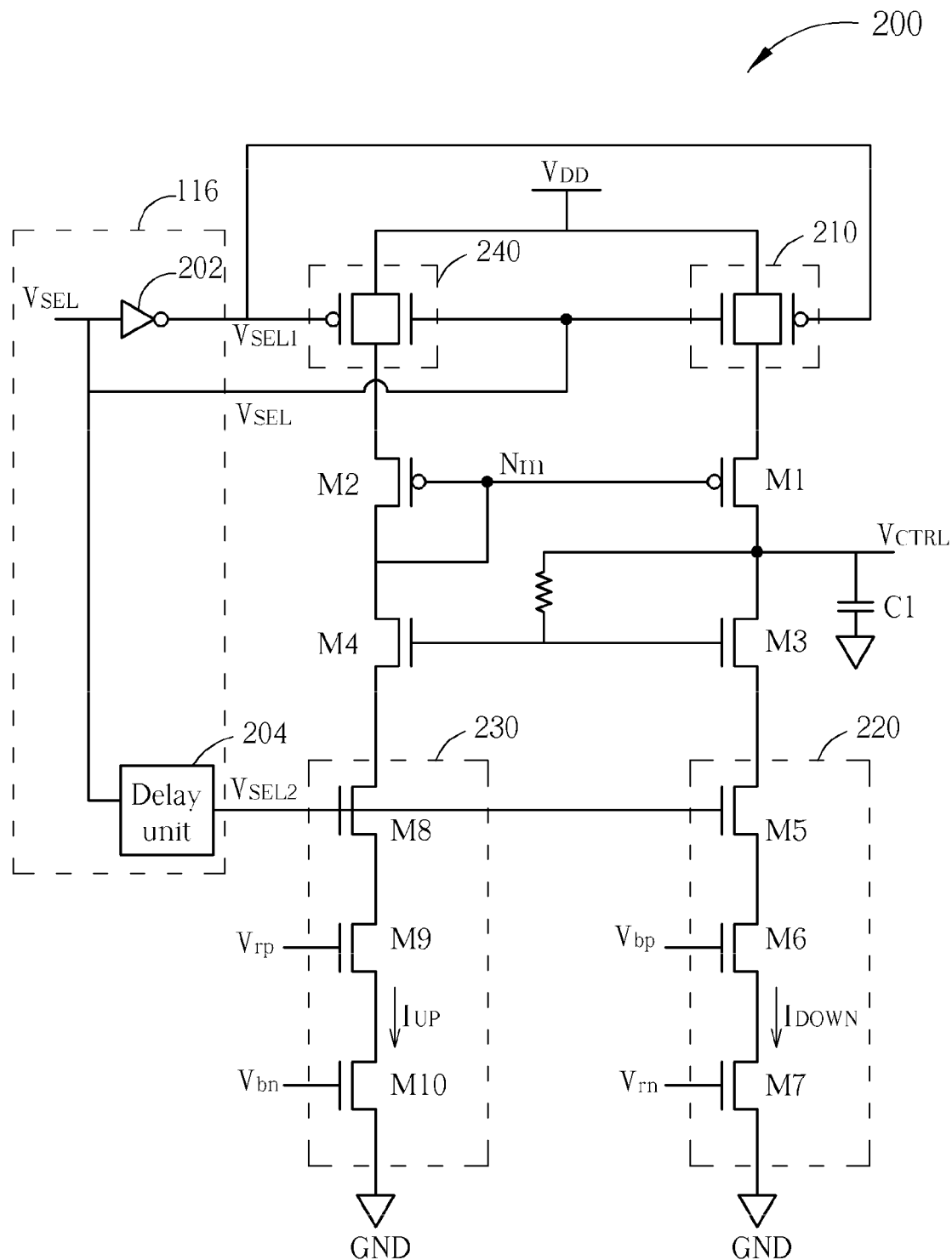
FIG. 2 is a circuit of the phase detector and the charge pump shown in FIG. 1 according to one embodiment of the present invention.

Please refer to FIG. 2. FIG. 2 is a circuit 200 of the phase detector 110 and the charge pump 120 according to one embodiment of the present invention. As shown in FIG. 2, the circuit 200 includes metal-oxide semiconductor (MOS) transistors M1-M4, a first selector 210 (in this embodiment, a transmission gate serves as the first selector 210), a second selector 220, a third selector 230, a fourth selector 240 (in this embodiment, a transmission gate serves as the fourth selector 240), and a selection signal generator 116. The selection signal generator 116 includes an inverter 202 and a delay unit 204, and is used for generating selection signals $V_{SEL}$, $V_{SEL1}$ and $V_{SEL2}$ according to the reference selection signal $V_{SEL}$. The first and the fourth selectors are coupled between the transistors M1, M2 and a first supply voltage $V_{DD}$, respectively, and are both controlled by two selection signals $V_{SEL}$ and $V_{SEL1}$. The second selector 220 is coupled between the transistor M3 and a second supply voltage GND, and serves as the AND gate 112 and includes three MOS transistors M5-M7 respectively controlled by the selection signal $V_{SEL2}$, the inverted feedback signal $V_{bp}$ and the reference signal $V_{rn}$. The third selector 230 is coupled between the transistor M4 and the second supply voltage GND, and serves as the AND gate 114 and includes three MOS transistors M8-M10 respectively controlled by the selection signal $V_{SEL2}$, the inverted reference signal $V_{rp}$ and the feedback signal $V_{bn}$.

The selection signal generator 116 utilizes the selection signal $V_{SEL2}$ to control the second and the third selectors 220 and 230, when the selection signal $V_{SEL2}$ is at a logic "1", the charge pump 120 is connected to the phase detector 110 and a capacitor $C_1$ is charged/discharged according to a current $I_{UP}/I_{DOWN}$; when the selection signal $V_{SEL2}$ is at a logic "0", the charge pump 120 is disconnected from the phase detector 110, and ideally, the control signal $V_{ctrl}$ will maintain a constant value.

It is noted that, when the selection signal $V_{SEL2}$ is switched from logic "1" to logic "0", the transistor M1 may not be completely switched off due to a residual voltage at a node Nm. In other words, at this time, the voltage level of the control signal $V_{ctrl}$ may be influenced if a tiny current of the transistor M1 exists.

Considering the above-mentioned issue that the transistor M1 may not be completely switched off, in the circuit 200 of the present invention, the delay unit 204 delays the reference selection signal $V_{SEL}$ to generate the selection signal $V_{SEL2}$. That is, the selection signal $V_{SEL2}$ lags behind the selection signals $V_{SEL}$ and $V_{SEL1}$. Therefore, when the selection signal $V_{SEL2}$ is switched from logic "1" to logic "0", the first and the fourth selectors 210 and 240 are switched off (the transistor M1 is disconnected from the first supply voltage $V_{DD}$) before the second and the third selectors 220 and 230 are switched off, and no current will exist in the transistor M1, so a voltage level of the control signal $V_{ctrl}$ will not be influenced even if the transistor M1 is not switched off completely.

It is noted that, in the circuit 200, the first and the fourth selectors 210 and 240 are the transmission gates which are controlled by both the selection signals $V_{SEL}$ and $V_{SEL1}$. However, in other embodiments of the present invention, the first and the fourth selectors 210 and 240 can be implemented by another circuit design such as a single NMOS or PMOS transistor which only needs to be controlled by one of the selection signals $V_{SEL}$ and $V_{SEL1}$ (i.e., the inverter 202 could be removed if only the selection signal $V_{SEL}$ is needed). These alternative designs all fall in the scope of the present invention.

It is also noted that, in the circuit 200, all the transistors M1-M10 are MOS transistors. In another embodiment of the present invention, however, the circuit 200 can be implemented by bi-polar junction transistors (BJTs) (i.e., the MOS transistors M1-M10 are replaced by BJTs). A person skilled in this art should understand how to utilize the BJTs to implement the circuit in the disclosed design after reading the above description, and therefore further description is omitted here.

Furthermore, in the circuit 200, the transistors M3 and M4 are optional devices and can be removed from the circuit 200; that is, the transistors M1 and M2 are coupled to the second and the third selectors 220 and 230, respectively. In addition, the fourth selector 240 is also an optional device and can be removed. These alternative designs all fall within the scope of the present invention.

Figure 3:
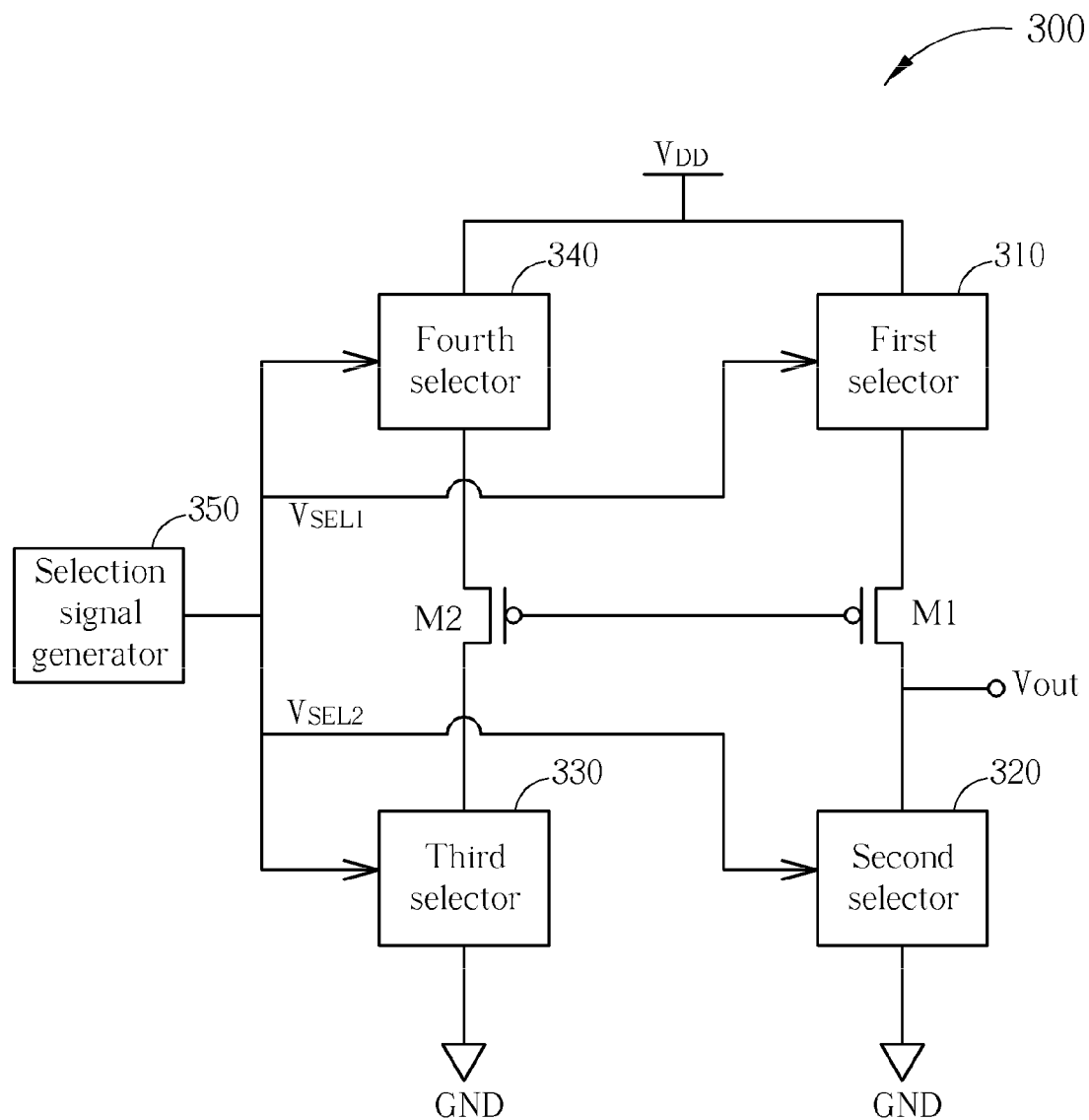
FIG. 3 is a generalized architecture of an exemplary charge pump of the present invention.

FIG. 3 is a generalized architecture of an exemplary charge pump 300 of the present invention. As shown in FIG. 3, the charge pump 300 includes two transistors M1 and M2, a first selector 310, a second selector 320, a third selector 330, a fourth selector 340 and a selection signal generator 350. The selection signal generator 350 generates a first selection signal $V_{SEL1}$ and a second selection signal $V_{SEL2}$, and utilizes the first selection signal $V_{SEL1}$ to control the first and the fourth selectors to selectively connect the transistors M1 and M2, respectively, to a first supply voltage VDD; and utilizes the second selection signal $V_{SEL2}$ to control the second and the third selectors to selectively connect the transistors M1 and M2, respectively, to a second supply voltage GND. The operations of the circuit 300 are similar to circuit 200 shown in FIG. 2. A person skilled in this art should therefore understand the operations of the circuit 300 after reading the above descriptions regarding the circuit 200 shown in FIG. 2. Further descriptions are omitted here for brevity.

Figure 4:
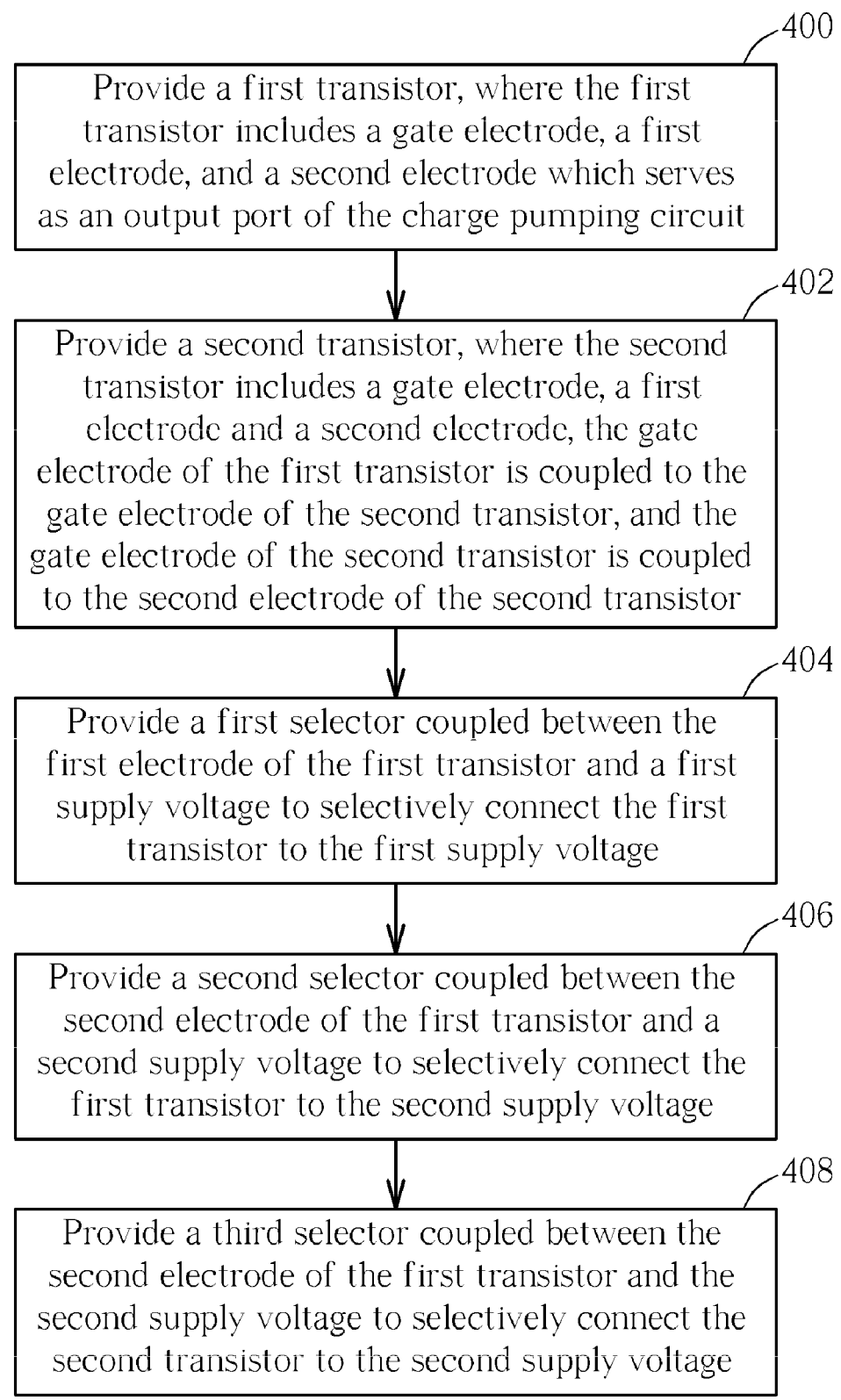
FIG. 4 is a flowchart of charging/discharging steps which can reduce a leakage current according to one embodiment of the present invention.

Please refer to FIG. 4. FIG. 4 is a flowchart of charging/discharging steps which can reduce a leakage current according to one embodiment of the present invention. Referring to the circuit 300 shown in FIG. 3 and the flowchart shown in FIG. 4, the method is as follows:

Step 400: provide a first transistor, where the first transistor includes a gate electrode, a first electrode, and a second electrode which serves as an output port;

Step 402: provide a second transistor, where the second transistor includes a gate electrode, a first electrode and a second electrode, the gate electrode of the first transistor is coupled to the gate electrode of the second transistor, and the gate electrode of the second transistor is coupled to the second electrode of the second transistor;

Step 404: provide a first selector coupled between the first electrode of the first transistor and a first supply voltage to selectively connect the first transistor to the first supply voltage;

Step 406: provide a second selector coupled between the second electrode of the first transistor and a second supply voltage to selectively connect the first transistor to the second supply voltage; and Step 408: provide a third selector coupled between the second electrode of the first transistor and the second supply voltage to selectively connect the second transistor to the second supply voltage.

Briefly summarized, according to the charge pump and the charging/discharging method, the output of the charge pump will not be influenced by a leakage current, and an accuracy of an output frequency of the VCO is improved.

Those skilled in the art will readily observe that numerous modifications and alterations of the device and method may be made while retaining the teachings of the invention.

What is claimed is:

1. A charge pump, comprising:
 a first transistor;
 a second transistor, including a gate electrode, a first electrode and a second electrode, wherein a gate electrode of the first transistor is coupled to the gate electrode of the second transistor, and the gate electrode of the second transistor is coupled to the second electrode of the second transistor;

a first selector, coupled between a first electrode of the first transistor and a first supply voltage, for selectively connecting the first transistor to the first supply voltage;

a second selector, coupled between a second electrode of the first transistor and a second supply voltage, for selectively connecting the first transistor to the second supply voltage;

a third selector, coupled between the second electrode of the first transistor and the second supply voltage, for selectively connecting the second transistor to the second supply voltage; and a selection signal generator, coupled to the first, the second and the third selectors, for generating at least a first selection signal and a second selection signal according to a reference selection signal, utilizing the first selection signal to control the first selector, and utilizing the second selection signal to control the second and the third selectors.

2. The charge pump of claim 1, wherein the selection signal generator comprises:

a delay unit, having a first end coupled to the reference selection signal and a second end coupled to the second and the third selectors, for making the second selection signal lag behind the first selection signal.

3. The charge pump of claim 1, further comprising:

a fourth selector, coupled between the first electrode of the second transistor and the first supply voltage, for selectively connecting the second transistor to the first supply voltage.

4. The charge pump of claim 3, wherein the selection signal generator is further coupled to the fourth selector, and the selection signal generator utilizes the first selection signal to control the fourth selectors.

5. The charge pump of claim 4, wherein the selection signal generator comprises:

a delay unit, having a first end coupled to the reference selection signal and a second end coupled to the second and the third selectors, for making the second selection signal lag behind the first selection signal.

6. A charging/discharging method capable of reducing a leakage current, comprising:

providing a first transistor, wherein the first transistor includes a gate electrode, a first electrode, and a second electrode which serves as an output port;

providing a second transistor, where the second transistor includes a gate electrode, a first electrode and a second electrode, wherein the gate electrode of the first transistor is coupled to the gate electrode of the second transistor, and the gate electrode of the second transistor is coupled to the second electrode of the second transistor;

providing a first selector coupled between the first electrode of the first transistor and a first supply voltage to selectively connect the first transistor to the first supply voltage;

providing a second selector coupled between the second electrode of the first transistor and a second supply voltage to selectively connect the first transistor to the second supply voltage;

providing a third selector coupled between the second electrode of the first transistor and the second supply voltage to selectively connect the second transistor to the second supply voltage; and providing a selection signal generator which is coupled to the first, the second and the third selectors, for generating at least a first selection signal and a second selection signal according to a reference selection signal;

utilizing the first selection signal to control the first selector; and utilizing the second selection signal to control the second and the third selectors.

7. The method of claim 6, wherein the step of generating at least the first selection signal and the second selection signal according to the reference selection signal comprises:

providing a delay unit having a first end coupled to the reference selection signal and a second end coupled to the second and the third selectors to make the second selection signal lag behind the first selection signal.

8. The method of claim 6, further comprising:

providing a fourth selector coupled between the first electrode of the second transistor and the first supply voltage to selectively connect the second transistor to the first supply voltage.

9. The method of claim 8, further comprising:

utilizing the first selection signal to control the fourth selectors.

10. The method of claim 9, wherein the step of generating at least the first selection signal and the second selection signal according to the reference selection signal comprises:

providing a delay unit having a first end coupled to the reference selection signal and a second end coupled to the second and the third selectors to make the second selection signal lag behind the first selection signal.

* * * * *